(12) United States Patent
Lee et al.

(10) Patent No.: US 6,531,372 B2
(45) Date of Patent: Mar. 11, 2003

(54) METHOD OF MANUFACTURING CAPACITOR OF SEMICONDUCTOR DEVICE USING AN AMORPHOUS TAON

(75) Inventors: Kee Jeung Lee, Seoul (KR); Hong Seon Yang, Kyoungki-do (KR)

(73) Assignee: Hynix Semiconductor, Inc., Ichon-shi (KR)

( * ) Notice: Subject to any disclaimer, the term of this patent is extended or adjusted under 35 U.S.C. 154(b) by 0 days.

(21) Appl. No.: 09/745,426

(22) Filed: Dec. 26, 2000

(65) Prior Publication Data

US 2001/0036703 A1 Nov. 1, 2001

(51) Int. Cl.[7] .............................................. H01L 21/20
(52) U.S. Cl. ...................... 438/396; 438/398; 438/253; 438/685
(58) Field of Search .................... 438/396, 253, 438/685, 684, 240, 254, 398, 665, 909, 785, 255, 256, 397, 399

(56) References Cited

U.S. PATENT DOCUMENTS 6,087,261 A * 7/2000 Nishikawa et al. ......... 438/685

6,337,291 B1 * 1/2002 Park et al. .................. 438/785

OTHER PUBLICATIONS

Derwent (Abstract), "Production Of A Capacitor Used In The Production Of DRAMs", 1999 Derwent Information LTD., #3117784.*

* cited by examiner

Primary Examiner—Olik Chaudhuri
Assistant Examiner—Yennhu B. Huynh
(74) Attorney, Agent, or Firm—Pillsbury Winthrop LLP

(57) ABSTRACT

The present invention discloses a method of manufacturing a TaON capacitor having a high capacity comprising the steps of forming an intermediate insulating layer on a semiconductor substrate; forming a lower electrode on the intermediate insulating layer; depositing a TaON thin film in an amorphous state on the lower electrode; annealing the amorphous TaON thin film in a vacuum state to form a crystalline TaON thin film that will serve as a dielectric layer; and forming an upper electrode on the dielectric layer made of the TaON thin film.

16 Claims, 7 Drawing Sheets

Composition of TaON thin film
after furnace annealing under $N_2O$ atmosphere

Composition of TaON thin film of a crystalline state after annealing of $N_2$ vaccum

METHOD OF MANUFACTURING CAPACITOR OF SEMICONDUCTOR DEVICE USING AN AMORPHOUS TAON

BACKGROUND OF THE INVENTION

1. Field of the Invention

The present invention relates to a method for manufacturing capacitors for semiconductor devices and, more particularly, to a method for manufacturing capacitors having a TaON dielectric film that exhibits both the improved electrical characteristics and the high capacitance values required for advanced semiconductor devices.

2. Description of the Related Art

As is well known, recent developments in semiconductor processing techniques have allowed the successful production of semiconductor products having increasingly high levels of integration. As a result, active research and development efforts continue to be directed toward both reducing cell area and reducing the device operating voltage. The reduction in cell area, however, has required a generally corresponding decrease in the area available for forming the capacitor while still requiring similar capacitance levels. In light of these competing demands, therefore, it has proven difficult to manufacture the more highly integrated memory devices.

Accordingly, there is a need for capacitors capable of providing sufficient capacitance in a reduced area to support the manufacture of highly integrated semiconductor devices, e.g. a memory device having more than 256M memory cells. In particular, the capacitance required for stable operation of the memory device is about 25 fF per cell. Capacitance values on this order are necessary to prevent the generation of soft errors and the corresponding reduction in refresh time, despite the decrease in the area available for forming the capacitor.

The basic capacitor structure, a dielectric layer interposed between a lower electrode and an upper electrode, is well known. Similarly, it is well known that the capacity of a given capacitor is proportional to both the surface area of the electrode and dielectric constant of the dielectric layer and is inversely proportional to the spacing between the electrodes, i.e. the thickness of the dielectric layer.

Efforts to increase capacity of the capacitor without increasing the cell size have included forming lower electrodes having complex three-dimensional structures such as cylinders, steps, and fins and the use of higher surface area materials such as hemispherical grain (HSG) polysilicon. Efforts to increase the capacitance have also included the use of dielectric materials having higher high dielectric constants.

However, because the process necessary to form capacitor lower electrodes having three-dimensional structures introduces additional difficulties and complications into the manufacturing process, recent efforts have focussed on developing a dielectric layer having a higher dielectric constant.

For example, a dielectric film having a multi-layer oxide/nitride/oxide (ONO) structure or a nitride/oxide (NO) structure are conventionally used as a dielectric layer of a capacitor. However, because the dielectric constant (E) of the NO structure is only 4~5 or so, it is difficult, if not impossible, to use an NO dielectric layer and still obtain sufficient capacity to prevent the generation of soft error and reduction in refresh time. Efforts are in progress to replace the NO dielectric layer and its 4~5 dielectric constant with a $Ta_2O_5$ thin film having a 25~27 dielectric constant. The higher dielectric constant of the $Ta_2O_5$ film permits the construction of capacitors having substantially higher capacitance than similarly sized NO capacitors.

The $Ta_2O_5$ thin film, however, deteriorates leakage current and dielectric characteristic of a capacitor. Consequently, it is difficult to use the $Ta_2O_5$ thin film as a dielectric layer.

In a nominal $Ta_2O_5$ thin film, however, substitutional Ta atoms inevitably exist as a result of composition ratio variations between Ta and O atoms within the film. The nominal stoichiometry simply does not reflect the chemical instability of the $Ta_2O_5$ thin film. In other words, substitutive Ta atoms in the form of oxygen vacancies are always locally present in the $Ta_2O_5$ thin film due to the variable and unstable stoichiometry of the $Ta_2O_5$ material. These oxygen vacancies then cause leakage current to be generated in a capacitor. Therefore, it is difficult to use the $Ta_2O_5$ thin film as the dielectric layer without additional treatment.

During the formation of the $Ta_2O_5$ thin film, the organic components from the $Ta(OC_2H_5)_5$, a precursor compound commonly used in forming the $Ta_2O_5$ film, can react with $O_2$ or $N_2O$ gas, so that impurities, that is, carbon (C), carbon compounds (such as $CH_4$ and $C_2H_4$), and water vapor ($H_2O$) are formed and incorporated into the thin film. As a result of these impurities, as well as other ions, free radicals, and the oxygen vacancies, in the $Ta_2O_5$ film, the resulting capacitors tend to exhibit increased leakage current and degraded dielectric characteristics.

For this reason, in order to prevent generation of leakage current in the $Ta_2O_5$ capacitors, it is necessary to perform both a separate oxidation process to stabilize the stoichiometry of the $Ta_2O_5$ thin film by oxidizing the substitutive Ta atoms present in the dielectric thin film and a series of low temperature thermal annealing processes. Using a $Ta_2O_5$ thin film as the dielectric layer, therefore, tends to complicate the whole process of manufacturing a capacitor. Further, an oxidation reaction may be generated at the interface between the lower electrode, usually polysilicon, and the $Ta_2O_5$ thin film during the low temperature thermal annealing process. This reaction, and the resulting formation of a thin oxide layer at the interface, further deteriorates the dielectric characteristics of the capacitor.

Consequently, a TaON thin film has been proposed as an alternative dielectric layer capable of obtaining the desired high capacity, low leakage current, and good dielectric characteristics. Like the $Ta_2O_5$ thin film, the TaON thin film is formed by the reaction between an organic metal compound ($Ta(OC_2H_5)_5$) and $O_2$ gas and, therefore, tends to include the same impurities such as carbon, carbon compounds and water vapor. Therefore, TAON thin films are typically annealed under $N_2O$ or $O_2$ gas atmosphere to remove or reduce the incorporated impurities.

On the other hand, concentrations of atoms existing in the dielectric layer of a capacitor in accordance with the conventional art in reference to FIGS. 4A and 4B are described as follows.

As shown in FIGS. 4A and 4B, in comparison with compositions of atoms including Ta, O, N, C, Si in TaON thin film when compositing amorphous TAON thin film in the conventional art and carrying out furnace annealing of $N_2O$, loss of nitrogen by furnace annealing is larger than that by depositing amorphous TaON thin film.

That is, a substitution Ta atom due to a difference in composition between Ta and O exists in TaON thin film.

Due to this, carbon atom and carbon compound including C, $CH_4O$, $C_2H_4$ and etc, and $H_2O$ are generated due to reaction of organic of $Ta(OC_2H_5)H_5$ in depositing a dielectric layer. Accordingly, a composition of nitrogen in TaON thin film is decreased, thereby increasing a leakage current of a capacitor and degrading largely a characteristic of a dielectric layer.

In the case of a TaON thin film, however, annealing under a $N_2O$ or $O_2$ gas atmosphere can cause nitrogen to be replaced by activated oxygen, thereby lowering the effective dielectric constant of the film. The need to anneal the TaON film and the resulting degradation of the dielectric constant act to limit the capacitance levels that can be reached by a capacitor using such a TaON thin film.

SUMMARY OF THE INVENTION

Accordingly, it is the object of the present invention to provide a method of manufacturing a capacitor for a semiconductor device that exhibits improved leakage current and improved dielectric characteristics using a TaON thin film as a dielectric layer.

A method of manufacturing a capacitor of a semiconductor device according to the present invention to accomplish the aforementioned object comprises the steps of: providing a semiconductor substrate over which selected lower patterns are formed and an intermediate insulating layer is covered; forming a lower electrode on the intermediate insulating layer; depositing a TaON thin film in an amorphous state on the lower electrode; annealing the amorphous TaON thin film in a vacuum state to form a crystalline TaON thin film as a dielectric layer; and forming an upper electrode on the dielectric layer made of the TaON thin film.

The objects, aspects, advantages, and practice of the present invention can be understood more easily in light of the following detailed description and the attached figures.

DETAILED DESCRIPTION OF THE INVENTION

Figure 1A:
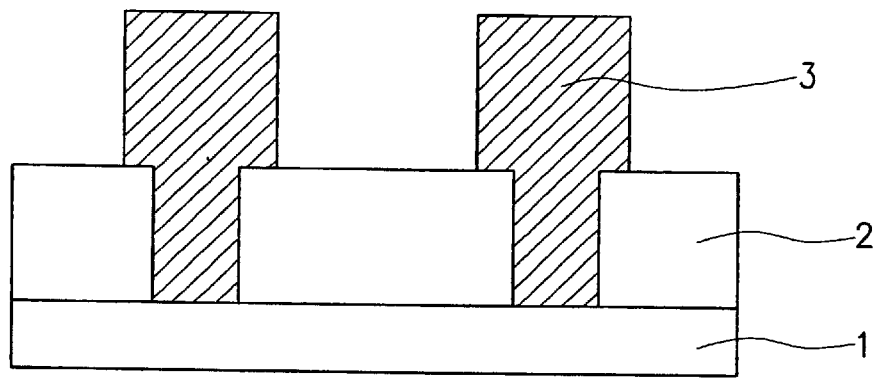
FIGS. 1A to 1D are cross-sectional views illustrating a method of manufacturing a capacitor using a TaON thin film as a dielectric layer according to one embodiment of the present invention.

FIG. 1A illustrates a semiconductor substrate 1 on which a lower pattern, such as a transistor (not shown), has been formed. A layer of an insulating material, such as USG, BPSG or SiON, is then deposited on the substrate 1 to cover the lower pattern and planarized to form intermediate insulating layer 2. A contact hole is formed on the intermediate insulating layer 2 to expose a selected portion of the substrate 1, preferably a source region. A doped polysilicon layer is then deposited on the intermediate insulating layer 2 in an LPCVD chamber. The polysilicon layer, which is sufficiently thick (approx. 300~500 Å) to completely bury the contact hole, is then patterned and etched to form a lower electrode 3 having a simple stacked structure.

Although the lower electrode 3 is illustrated as having only a simple stacked structure, it may also be configured as a three-dimensional structure such as cylinder, step, or fin structure and may include a hemispherical grain (HSG) polysilicon surface.

Figure 1B:
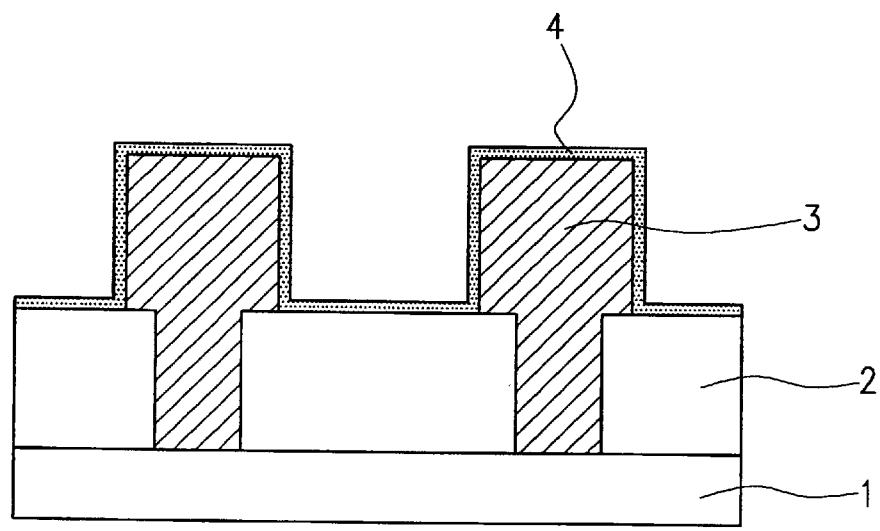

Referring to FIG. 1B, an amorphous TaON thin film 4 (approx. 50~150 Å) is then deposited on the lower electrode 3 through surface chemical reaction between a Ta chemical vapor and a reaction gas, ammonia (5–500 sccm $NH_3$), in a LPCVD chamber maintained at a temperature of between 300 and 600° C. and a pressure of less than 100 Torr. The Ta chemical vapor is obtained by evaporating a 99.999% solution of $Ta(OC_2H_5)_5$ in an evaporator at a temperature of more than 150° C., and preferably between 150 and 200° C. The $Ta(OC_2H_5)_5$ solution is fed into the evaporator at a controlled rate, preferably at a rate of less than 300 mg/minute using a flow controller such as mass flow controller (MFC). The full flow path of the Ta chemical vapor from the evaporator to the LPCVD chamber, including any orifice, nozzle or supply tubes is also held at a temperature of between 150 and 200° C. in order to prevent the condensation of the Ta chemical vapor.

The capacitor lower electrode 3 may be cleaned before depositing the amorphous TAON thin film 4 in order to remove a natural oxidation layer and particle made on the surface of the capacitor lower electrode 3. The cleaning process may include either a dry cleaning using HF vapor or a wet cleaning using a HF solution.

The capacitor lower electrode 3 may be nitrified during a subsequent thermal process before depositing the amorphous TaON thin film 4. The nitrification of the lower electrode 3 prevents deterioration of the TaON thin film quality and increased leakage current that would result from the presence of an oxidation layer such as $SiO_2$ at the interface between the lower electrode 3 and the TaON thin film 4. This nitrification can be accomplished using an in-situ plasma under an $NH_3$ atmosphere for 1 to 50 minutes.

Figure 1C:
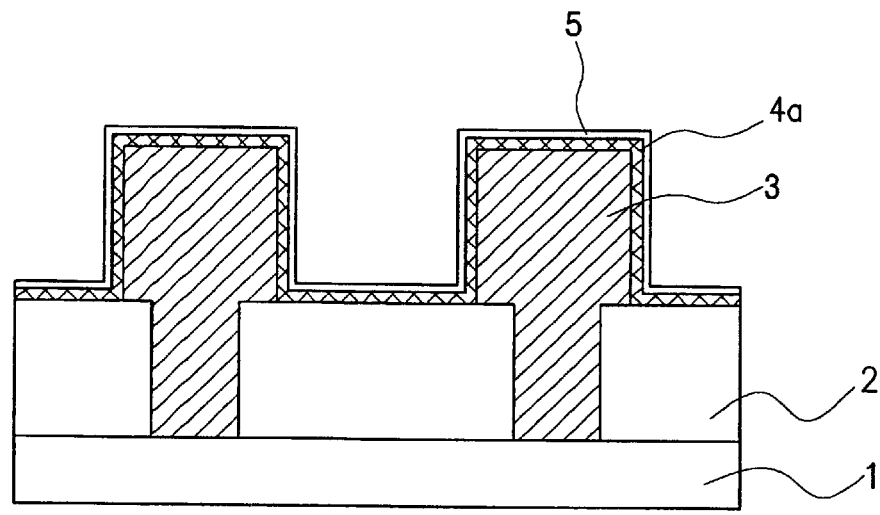

Referring to FIG. 1C, a TaON thin film 4a crystallized to serve as a dielectric layer is formed by annealing the amorphous TaON thin film in a $N_2$ or $NH_3$ atmosphere using a furnace (at a temperature of 700~800° C. and a pressure less than 100 torr) or by annealing the amorphous TaON layer (at a temperature of 750~950° C. and a pressure at 700~750 torr) than using a rapid thermal process (RTP) By annealing the amorphous TaON thin film under reduced pressure and in an environment having no volatile oxygen, the TaON thin film 4a crystallizes in a nitrogen state and maintains the binding structure of the Ta—O—N structure.

Accordingly, the TaON thin film 4a annealed in a nitrogen-rich atmosphere according to the present invention has high dielectric constant and typically contains 15~30% nitrogen. As a result of annealing the TaON thin film 4a, exchangeable Ta atoms that had remained in the amorphous TaON thin film are removed, thereby improving leakage current characteristics of the resulting capacitors.

An oxidation layer 5 (approx. 20~30 Å) is then formed on the surface of the TaON thin film 4a by further annealing the surface of the TaON thin film 4a under reduced pressure, e.g., less than 100 Torr. This additional annealing process for the TaON thin film 4a is performed under $O_2$ or $N_2O$ gas atmosphere at 600~950° C. using plasma (at a temperature of 400~500° C. and a pressure at 700~750 torr) or RTP (at a temperature of 750~950° C. and a pressure at 700~750 torr) in order to improve the leakage current and breakdown voltage characteristics of the resulting capacitor.

Figure 1D:
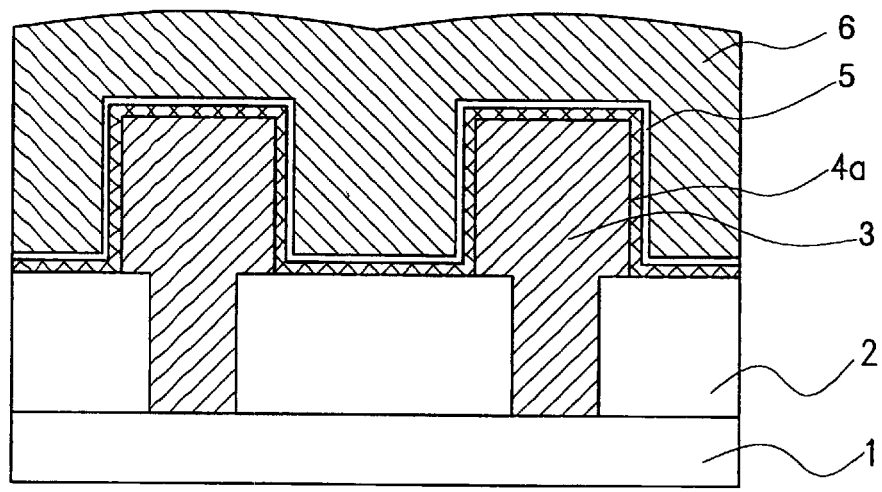

Referring to FIG. 1D, a capacitor upper electrode 6 is formed by depositing a doped polysilicon layer (approx. 500~2,000 Å) on the oxidation layer. This layer of doped polysilicon is then patterned and etched to obtain the desired TaON capacitor having a Silicon-Insulator-Silicon (SIS) structure with the TaON thin film acting as the dielectric layer.

Figure 2:
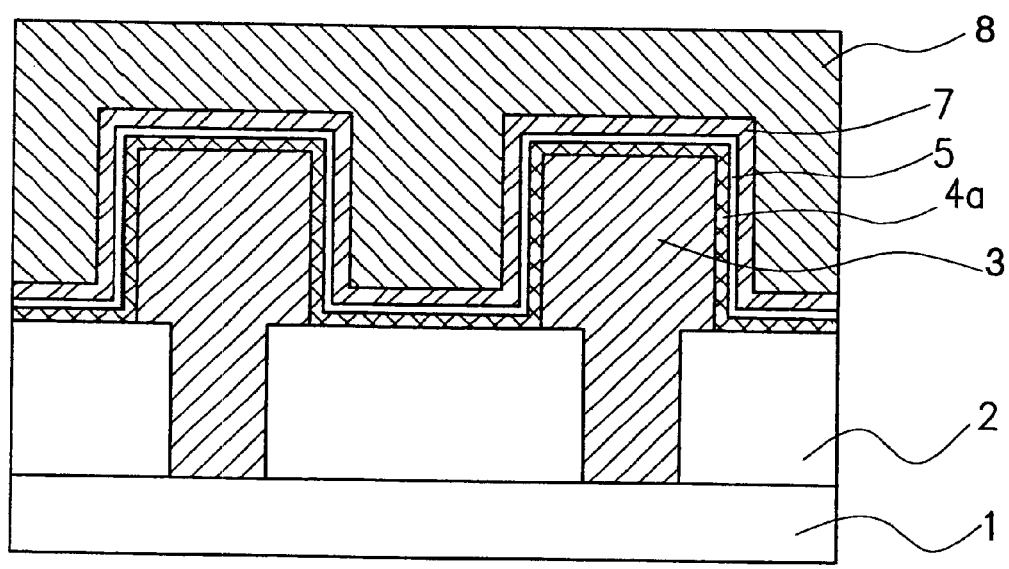
FIG. 2 is a cross-sectional view showing a capacitor having an MIS structure manufactured according to another embodiment of the present invention.

Alternatively, the capacitor upper electrode 6 may be formed from a metal material (approx. 200~800 Å) such as one selected from a group consisting of TiN, TaN, W, WSi, Ru, $RuO_2$, Ir, $IrO_2$ and Pt rather than doped polysilicon. In this case, as shown in FIG. 2, the whole structure of the TaON capacitor is a Metal-Insulator-Silicon (MIS) structure. And as also shown in FIG. 2, the upper electrode may be formed with a stacked structure including a doped polysilicon buffer layer 8 (approx. 500~2,000 Å) is formed over an upper electrode 7 made from a metal layer.

It is preferable to make the capacitor lower electrode 3 of the doped polysilicon layer. However, like the upper electrode, the capacitor lower electrode 3 may be formed from a metal material selected from a group consisting of TiN, TaN, W, WSi, Ru, $RuO_2$, Ir, $IrO_2$ and Pt. In such an instance, the whole structure of the TaON capacitor is a Metal-Insulator-Metal (MIM) structure. Particularly, in those instances in which a metal layer is used as the lower electrode, it is unnecessary to clean and nitrify the lower electrode as discussed previously.

Figure 3:
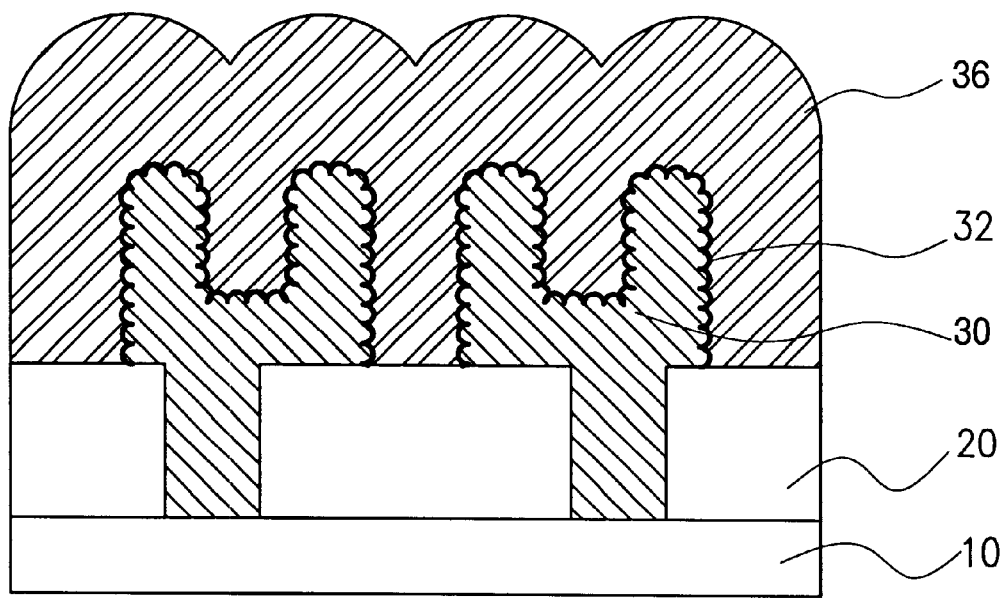
FIG. 3 is a cross-sectional view showing a capacitor having an MIS structure manufactured according to another embodiment of the present invention.
Figure 4A:
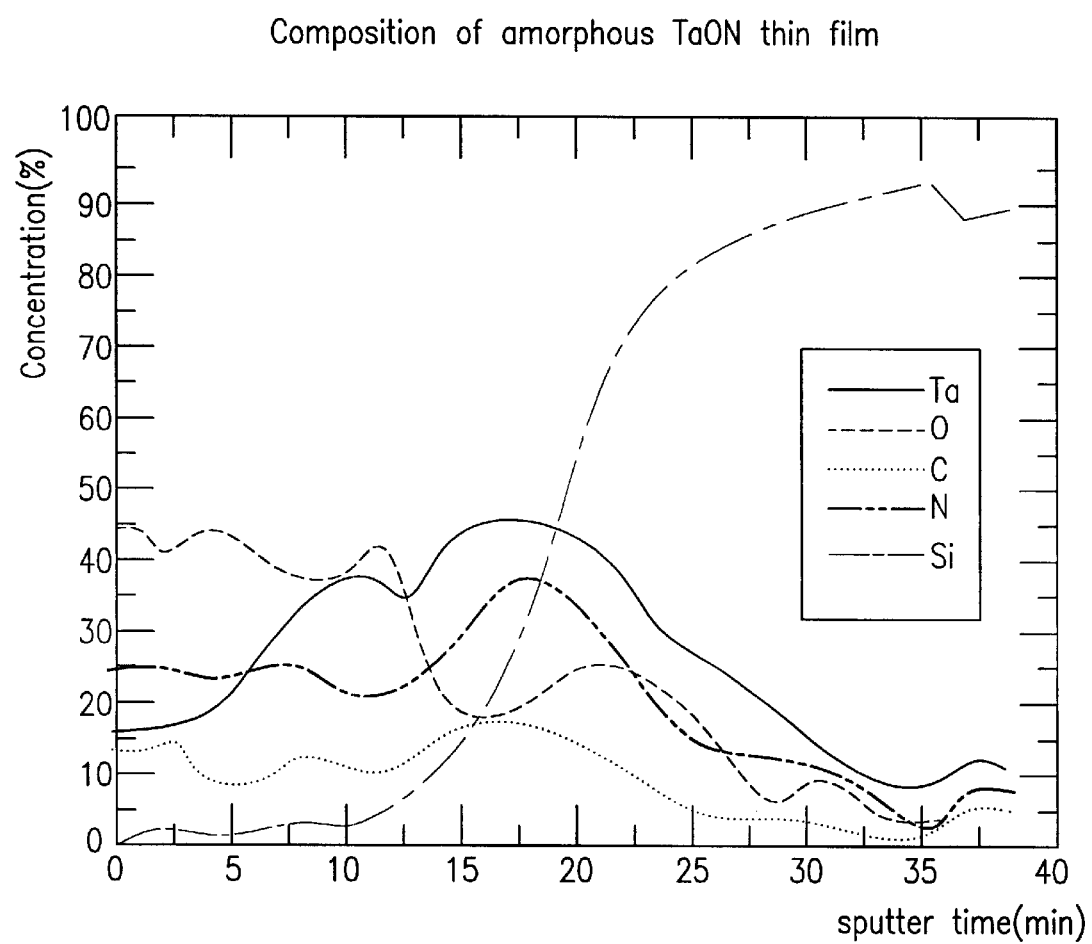
FIGS. 4A and 4B show compositions of atoms including Ta, O, N, C, Si in TaON thin film when compositing amorphous TaON thin film and carrying out furnace annealing of $N_2O$ in conventional art, respectively.
Figure 4B:
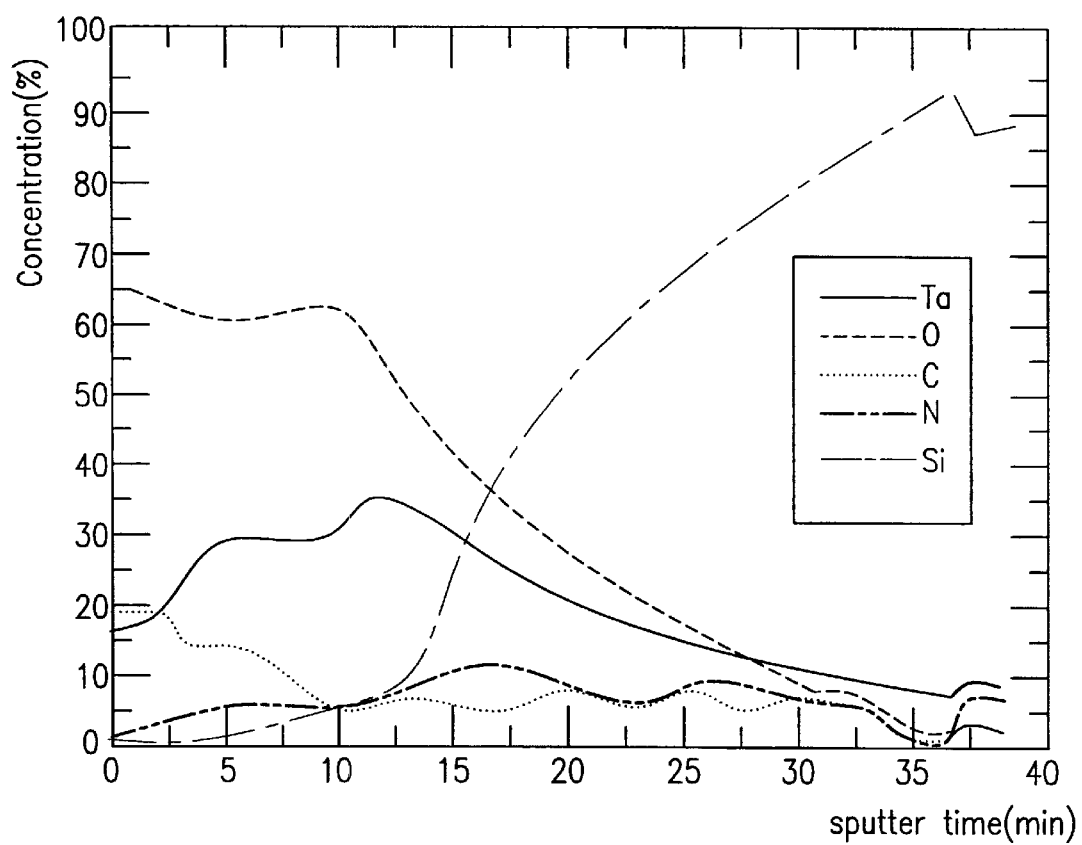

As shown in FIG. 3, each lower electrode 30 has, at an upper surface thereof, a hemi-spherical grain (HSG) structure obtained by growing polysilicon in the form of HSGS. Thereafter, a TaON dielectric film 92 is formed over the lower electrodes 30 in the same fashion of FIG. 2.

Finally, upper electrodes 36 are formed on the TaON dielectric film 32. Thus, the fabrication of capacitors is completed.

Figure 5:
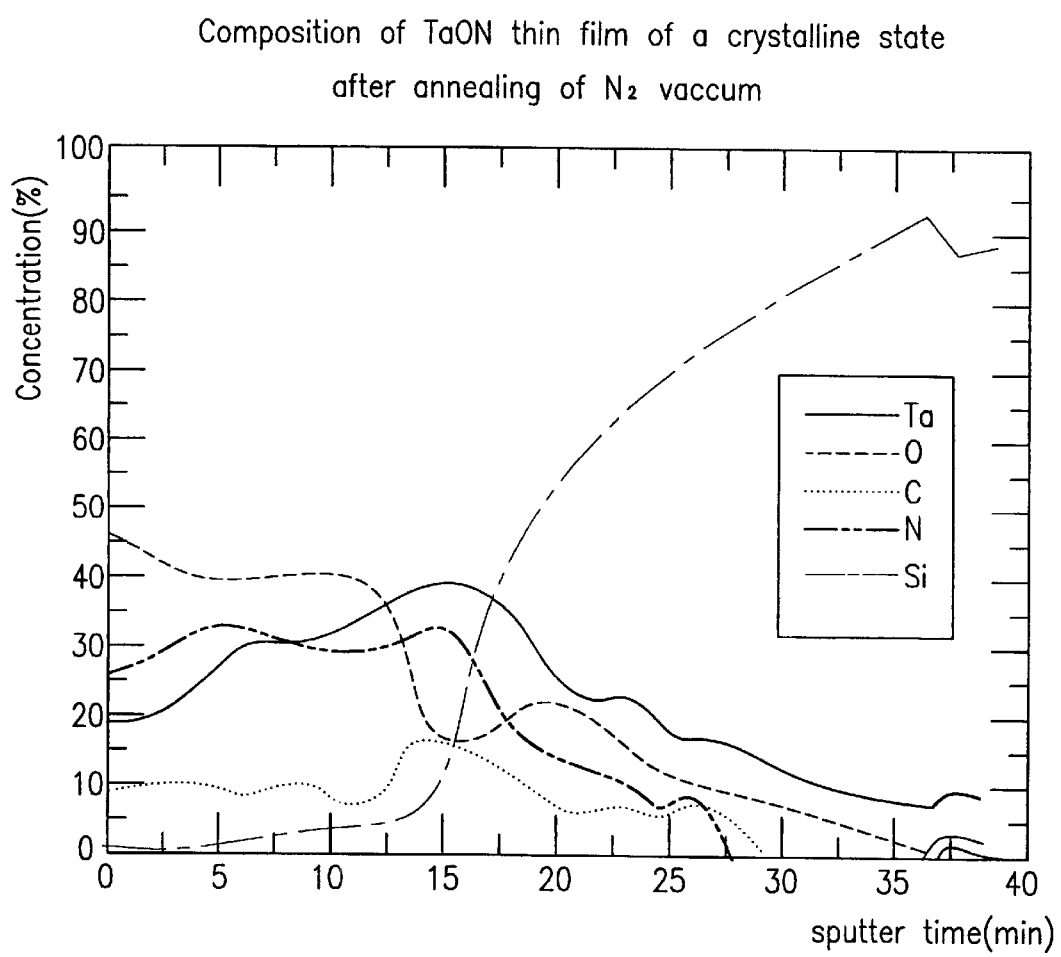
FIG. 5 shows compositions of atoms including Ta, O, N, C, Si in TaON thin film when compositing amorphous TaON thin film and carrying out vacuum annealing under $N_2$ atmosphere in the present invention.

As shown in FIG. 5, if annealing is carried out in vacuum state under $NH_3$ or $N_2$, content of nitrogen of Ta, O, N, C, Si existing in TaON thin film by a vacuum annealin process is existed instantly to 15 to 30%.

Accordingly, it is capable of obtaining TaON thin film having a high dielectric factor than when proceeding a furnace or rapid thermal process under $N_2O$ or $O_2$ atmosphere in the conventional art.

As described above, in the method of manufacturing a capacitor of the present invention, the TaON thin film having a high dielectric constant on the order of 25~27 is used as the dielectric layer to obtain substantial increases in capacity as compared with conventional NO or ONO dielectrics. Further, because a simple stacked structure is capable of providing sufficient capacitance, the manufacturing process may be simplified. Loss of nitrogen content in the TaON thin film can be prevented by annealing the TaON thin film under a reduced pressure in a nitrogen-rich atmosphere and thereby produce a TaON capacitor that exhibits both good leakage current and dielectric characteristics.

Because the TaON capacitors manufactured according to the present invention can provide the desired high capacity, stable leakage current, and good dielectric characteristics, such capacitors are suitable for use in next generation very highly integrated memory devices such as DRAMs having more than 256M cells.

Various other modifications to the basic process will be apparent to and can be readily made by those skilled in the art without departing from the scope and spirit of the present invention.

What is claimed is:

1. A method of manufacturing a capacitor of a semiconductor device, comprising the steps of:
   providing a semiconductor substrate over which selected lower patterns are formed and an intermediate insulating layer is covered:
   forming a lower electrode on the intermediate insulating layer;
   cleaning the lower electrode after the step of forming the lower electrode;
   nitrifying the surface of the lower electrode after the step of forming the lower electrode;
   depositing a TaON thin film in an amorphous state on the lower electrode;
   annealing the amorphous TaON thin film in a vacuum state to form a crystal TaON thin film as a dielectric layer; and
   forming an upper electrode on the dielectric layer made of the TaOn thin film.

2. The method according to claim 1, wherein the lower electrode comprises doped polysilicon.

3. The method according to claim 1, wherein the lower electrode consists essentially of one material selected from a group consisting of TiN, TaN, W, WSi, Ru, $RuO_2$, Ir, $IrO_2$, and Pt.

4. The method according to claim 1, wherein the cleaning step is performed by a dry method using HF vapor or a wet method using HF solution.

5. The method according to claim 1, wherein the nitrifying step is performed through In-situ plasma under $NH_3$ gas atmosphere for 1 to 5 minutes.

6. The method according to claim 1, wherein the step of depositing the amorphous TaON thin film further comprises reacting a predetermined amount of a Ta compound vapor and a reaction gas, the reaction gas comprising $NH_3$ or $O_2$, in a LPCVD chamber at a temperature of between 300 and 600° and at a pressure of less than 100 Torr.

7. The method according to claim 6, wherein the Ta compound vapor is obtained by supplying a selected amount of a $Ta(OC_2H_5)_5$ solution into an evaporator, the evaporator being maintained at a temperature of between 150 and 200° C., evaporating the $Ta(OC_2H_5)_5$ solution to form the Ta compound vapor, and injecting the Ta compound vapor into the LPCVD chamber.

8. The method according to claim 1, wherein the amorphous TaON thin film is annealed under a reduced pressure of less than 100 Torr in a $N_2$ or $NH_3$ atmosphere and at a temperature between 600 and 950° C.

9. The method according to claim 1, further comprising an additional annealing step, the additional annealing step being completed after the step of annealing the amorphous TaON thin film under reduced pressure and before the step of forming the upper electrode.

10. The method according to claim 9, wherein the additional annealing step is performed under an $O_2$ or $N_2O$ atmosphere or under an $UV-O_3$ or $O_3$ atmosphere at a temperature of between 600 and 950° C.

11. The method according to claim 1, wherein the upper electrode comprises doped polysilicon.

12. The method according to claim 1, wherein the upper electrode consists essentially of one material selected from a group consisting of TiN, TaN, W, WSi, Ru, $RuO_2$, Ir, $IrO_2$ and Pt.

13. The method according to claim 1, wherein the upper electrode comprises a multi-layer structure, the multi-layer structure comprising a buffer layer formed on a metal layer.

14. The method according to claim 13, wherein the metal layer consists essentially of one material selected from a group consisting of TiN, TaN, W, WSi, Ru, $RuO_2$, Ir, $IrO_2$ and Pt, and further wherein the buffer layer comprises doped polysilicon.

15. A method of manufacturing a capacitor of a semiconductor device, comprising the steps of:

providing a semiconductor substrate over which selected lower patterns are formed and an intermediate insulating layer is covered;

forming a lower electrode on the intermediate insulating layer;

cleaning the lower electrode by a dry method using HF vapor or a wet method using HF solution after the step of forming the lower electrode;

nitrifying the surface of the lower electrode after the step of forming the lower electrode;

depositing a TaON thin film in an amorphous state on the lower electrode;

annealing the amorphous TaON thin film in a vacuum state to form a crystal TaON thin film as a dielectric layer; and forming an upper electrode on the dielectric layer made of the TaON thin film.

16. A method of manufacturing a capacitor of a semiconductor device, comprising the steps of:

providing a semiconductor substrate over which selected lower patterns are formed and an intermediate insulating layer is covered;

forming a lower electrode on the intermediate insulating layer;

cleaning the lower electrode by a dry method using HF vapor or a wet method using HF vapor or a wet method using HF solution after the step of forming the lower electrode;

nitrifying the surface of the lower electrode by In-situ plasma under $NH_3$ gas atmosphere for 1 to 5 minutes after the step of forming the lower electrode;

depositing a TaON thin film in an amorphous state on the lower electrode;

annealing the amorphous TaON thin film in a vacuum state to form a crystal TaON thin film as a dielectric layer; and forming an upper electrode on the dielectric layer made of the TaON thin film.

* * * * *